United States Patent [19]

Jacobson et al.

[11] Patent Number: 4,968,382

[45] Date of Patent: Nov. 6, 1990

[54] ELECTRONIC DEVICES

[75] Inventors: Susan E. Jacobson, Edgware; Rosemary A. Lee, Northwood; Helen A. Williams, High Wycombe, all of Great Britain

[73] Assignee: The General Electric Company, p.l.c., England

[21] Appl. No.: 464,170

[22] Filed: Jan. 12, 1990

[30] Foreign Application Priority Data

Jan. 18, 1989 [GB] United Kingdom ................. 8901087

[51] Int. Cl.[5] ...................... H01L 21/306; B44C 1/22; C23F 1/02; C03C 15/00

[52] U.S. Cl. .................................... 156/643; 156/646; 156/651; 156/656; 156/657; 156/659.1; 156/661.1; 156/662; 204/192.35; 204/192.37; 252/79.1

[58] Field of Search ............... 156/643, 646, 651, 654, 156/656, 657, 659.1, 661.1, 662; 204/192.32, 192.35, 192.37; 252/79.1

[56] References Cited

U.S. PATENT DOCUMENTS

| | | | |
|---|---|---|---|
| 3,045,321 | 7/1962 | McDermott | 29/78 |
| 3,998,678 | 12/1976 | Fukase et al. | 156/651 |
| 4,685,996 | 8/1987 | Busta et al. | 156/651 X |
| 4,874,463 | 10/1989 | Koze et al. | 156/645 |
| 4,916,002 | 4/1990 | Carver | 428/139 |

*Primary Examiner*—William A. Powell

*Attorney, Agent, or Firm*—Kirschstein, Ottinger, Israel & Schiffmiller

[57] ABSTRACT

In the production of micron-size pyramid emitters for field emission devices, very sharp emitter points are achieved by providing a layer of suitable metal, metal compound or semiconductor, forming masking pads over the required emitter positions, etching the layer so that column-like structures are formed beneath the pads, removing the pads, and then subjecting the columns to dry etching, such as plasma etching, reactive ion etching, ion beam milling or reactive ion beam milling. The dry etching process shapes the columns into pyramids with a tip size of the order of 0.03 microns.

13 Claims, 3 Drawing Sheets

ELECTRONIC DEVICES

Figure 1A:
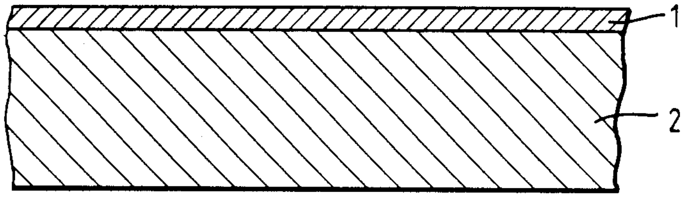
Figure 1B:
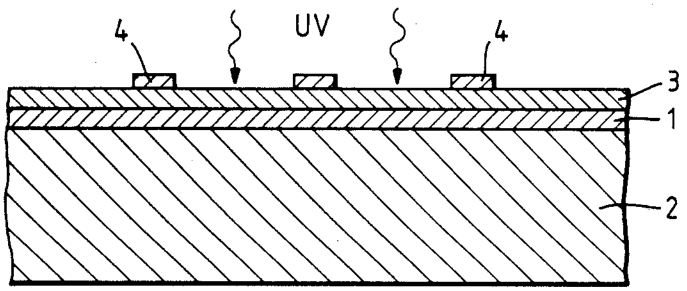
Figure 1C:
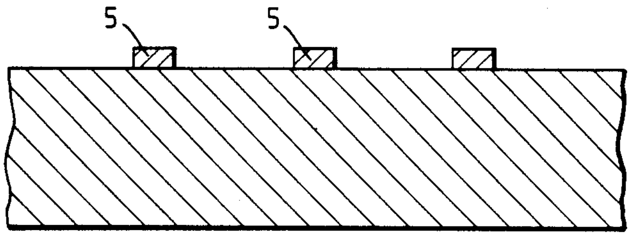
Figure 1D:
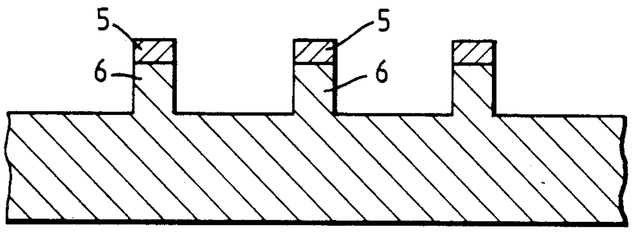
Figure 1E:
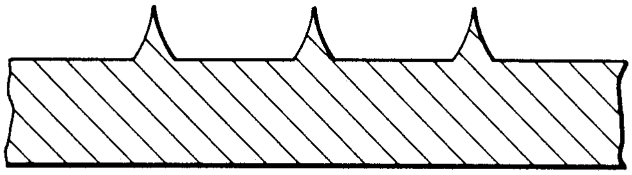

This invention relates to a method of forming pointed electrodes for electron emission devices, such as field emission devices.

During recent years there has been considerable interest in the construction of field emission devices having cathode dimensions and anode/cathode spacings of the order of only a few microns. In the manufacture of some such devices, arrays of pyramid-shaped cathodes have been formed by wet etching a substrate of silicon on which are first deposited pads of a suitable etch-resistant material, so that unwanted regions are etched away, leaving the required pyramid-shaped projections beneath the pads.

In the construction of micron-sized field emission devices it is essential to achieve good emission at the lowest possible applied voltage between the pyramid-shaped cathode and the anode. This requires the provision of as sharp a point as possible on the cathode structure.

It is an object of the present invention to provide a method of forming such tapered structures with improved tip sharpness.

According to the invention there is provided a method of forming an electrode, the method comprising providing a layer of electrically-conductive material; forming a masking pad on said layer in the required position for said electrode; etching the layer so that an electrode structure is formed beneath the pad; removing the pad; and dry etching the structure to produce a sharply-pointed electrode.

Embodiments of the invention will now be described, by way of example, with reference to the accompanying drawings, in which FIGS. 1(*a*)–1(*d*) illustrate, schematically, stages in a first method in accordance with the invention, FIGS. 2(*a*)–2(*c*) illustrate, schematically, stages in a second method, and FIGS. 3(*a*)–3(*d*) illustrate, schematically, stages in a third method.

Referring to FIG. 1(*a*), a layer 1 of silicon dioxide of, say, 1000–4000 Å thickness is thermally grown on a silicon substrate 2. A layer 3 of resist (FIG. 1(*b*)) is deposited through a mask 4. The resist layer is developed, and unwanted parts removed, thereby. forming an etching mask. The silicon dioxide layer 1 is then etched through the latter mask, leaving silicon dioxide pads 5 on the surface of the substrate 2. FIG. 1(*c*)).

The substrate is then subjected to a plasma etch using $SF_6/Cl_2/O_2$, and columns 6 are left beneath the pads 5. (FIG. 1(*d*)).

The pads 5 are then removed from the tops of the columns, and the device is exposed to a reactive ion etching process using $SF_6/N_2$, which produces very sharply-pointed tapering electrodes from the columns.

This method of dry etching produces electrodes which are very such sharper than electrodes which have previously been produced by the conventional wet etching techniques. Indeed, tapered electrodes of 2 microns height and 1 micron base and having a tip size of only 0.03 micron have been produced by the method in accordance with the invention.

In a modification of the method described above, initial wet etching of the substrate could be used to produce tapered electrodes instead of the substantially parallel-sided columns 6 of FIG. 1(*d*). The pads 5 would then be removed, and a dry etching process would be used to sharpen the electrodes.

The method or the modification described above could be used for some other substrate materials, such as niobium. A dry etching technique can be used for substrates of silicon with various doping densities, sputtered niobium, molybdenum or gold, and single crystal nickel, tungsten and rhodium. Some substrate materials may require different dry etching techniques from the plasma etching and reactive ion etching described above, and different etchants may be required. Other possible forms of dry etching comprise ion beam milling and reactive ion beam milling.

Figure 2A:
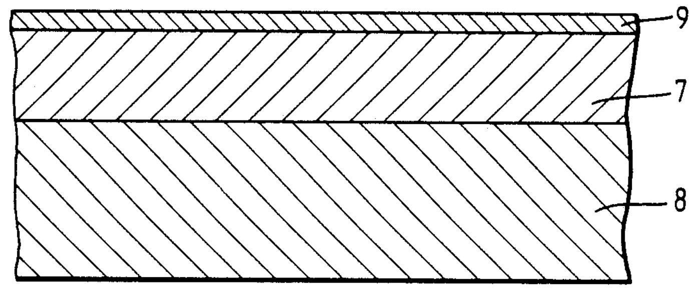
Figure 2B:
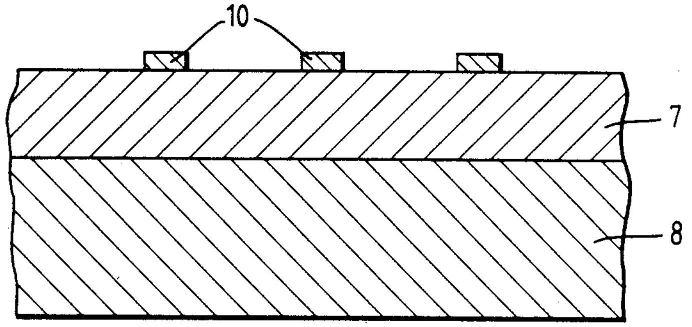
Figure 2C:
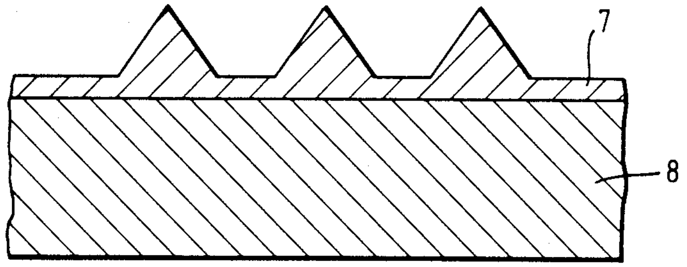
Figure 3A:
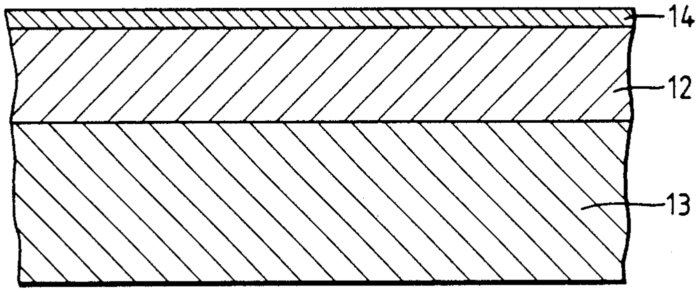
Figure 3B:
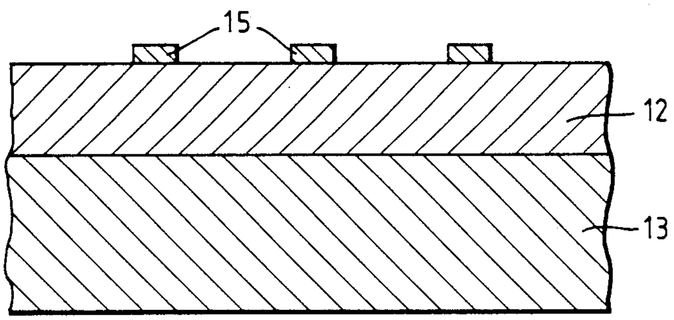
Figure 3C:
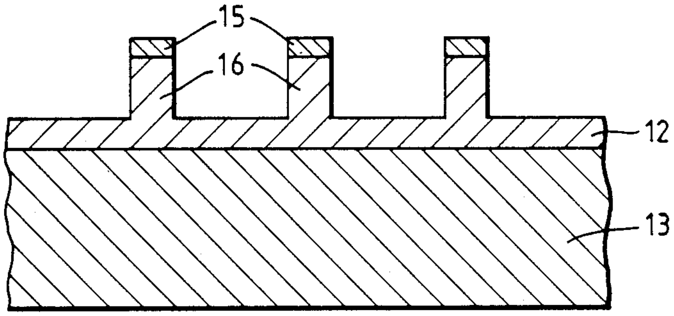
Figure 3D:
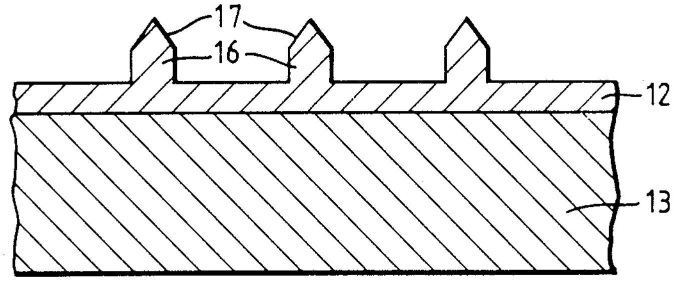

FIG. 2 illustrates a method in accordance with the invention for forming sharply-pointed gold electrodes. A layer 7 of gold of, say, 2 microns thickness is deposited on a silicon substrate 8, and a layer 9 of resist is deposited over the layer 7 (FIG. 2(*a*)). The resist layer 9 is patterned to produce pads 10 (FIG. 2(*b*) on the gold layer. Alternatively, titanium pads may be formed on the gold layer.

The gold layer is then dry etched by argon ion beam milling at a suitable angle to the plane of the substrate while the substrate is rotated in its plane. During the course of the etching, the pads 10 become completely eroded away, and the etching is thereafter continued without the pads. Sharply-pointed gold electrodes are thereby produced (FIG. 2(*c*)).

An alternative method of producing pointed gold electrodes is illustrated in FIG. 3. Similarly to FIG. 2, a layer 12 of gold is deposited on a silicon substrate 13 and a resist layer 14 is deposited thereover (FIG. 3(*a*)). The layer 14 is patterned to produce pads 15 on the gold layer 12 (FIG. 3(*b*)).

The layer 12 is then subjected to argon ion beam milling perpendicular to the major plane of the substrate while the substrate is rotated in that plane. This produces substantially straight-sided columns 16 beneath the pads (FIG. 3(*c*)). The pads 15 are then removed, and the columns are subjected to further ion beam milling at an angle of, say, 15° to the perpendicular while the substrate is rotated. This produces very sharp tips 17 on the columns 16, as shown in FIG. 3(*d*).

The methods in accordance with the invention can be used to produce single pointed structures or arrays of such structures with sub-micron tips. Packing densities can be as high as about $2.5 \times 10^7$ tips/cm$^2$.

The structures may be used, for example, in field emitting diodes or triodes or as cold cathode sources.

We claim:

1. A method of forming an electrode, the method comprising providing a layer of electrically-conductive material; forming a masking pad on said layer in the required position for said electrode; etching the layer so that an electrode structure is formed beneath the pad; removing the pad; and dry etching the structure to produce a sharply-pointed electrode.

2. A method as claimed in claim 1, wherein the etching of the layer to form an electrode structure is effected by a wet etching process.

3. A method as claimed in claim 1, wherein the etching of the layer to form an electrode structure is effected by a dry etching process.

4. A method as claimed in claim 3, wherein the etching of the layer and the dry etching of the structure are effected in a substantially continuous process; and wherein the pad is removed by said process.

5. A method as claimed in claim 1, wherein the dry etching is effected by plasma etching, reactive ion etching, ion beam milling, or reactive ion beam milling.

6. A method as claimed in claim 3, wherein the etching of the layer is effected by a plasma etching process and the dry etching of the structure is effected by a reactive ion etching process.

7. A method as claimed in claim 6, wherein the plasma etching process is carried out in $SF_6/Cl_2/O_2$.

8. A method as claimed in claim 6, wherein the reactive ion etching process is carried out in $SF_6/N_2$.

9. A method as claimed in claim 1, wherein the electrode structure formed beneath the pad is tapered.

10. A method as claimed in claim 1, wherein the electrode structure formed beneath the pad is a substantially parallel-sided column.

11. A method as claimed in claim 1, wherein the layer is formed of a semiconductor, a metal or a metal compound.

12. A method as claimed in claim 11, wherein the layer is formed of silicon, niobium, molybdenum, gold, nickel tungsten or rhodium.

13. A method as claimed in claim 12, wherein the layer is formed of single crystal nickel, tungsten or rhodium.

* * * * *